(12) United States Patent
Matsumoto et al.

(10) Patent No.: US 10,204,853 B2
(45) Date of Patent: Feb. 12, 2019

(54) SEMICONDUCTOR DEVICE

(71) Applicant: Renesas Electronics Corporation, Tokyo (JP)

(72) Inventors: Masahiro Matsumoto, Hitachinaka (JP); Akira Yajima, Hitachinaka (JP); Kazuyoshi Maekawa, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/621,745

(22) Filed: Jun. 13, 2017

(65) Prior Publication Data

US 2017/0372996 A1 Dec. 28, 2017

(30) Foreign Application Priority Data

Jun. 27, 2016 (JP) ................. 2016-126931

(51) Int. Cl.
*H01L 23/48* (2006.01)
*H01L 23/498* (2006.01)
(Continued)

(52) U.S. Cl.
CPC ........ *H01L 23/49838* (2013.01); *H01L 23/13* (2013.01); *H01L 23/3171* (2013.01); *H01L 24/03* (2013.01); *H01L 24/05* (2013.01); *H01L 24/32* (2013.01); *H01L 24/45* (2013.01); *H01L 24/48* (2013.01); *H01L 24/49* (2013.01); *H01L 24/73* (2013.01); *H01L 24/85* (2013.01); *H01L 24/97* (2013.01); *H01L 2224/02166* (2013.01); *H01L 2224/04042* (2013.01); *H01L 2224/05083* (2013.01); *H01L 2224/05084* (2013.01); *H01L 2224/05554* (2013.01); *H01L 2224/05558* (2013.01); *H01L 2224/05644* (2013.01); *H01L 2224/05655* (2013.01); *H01L 2224/05664* (2013.01); *H01L 2224/32245* (2013.01); *H01L 2224/45144* (2013.01);
(Continued)

(58) Field of Classification Search
None
See application file for complete search history.

(56) References Cited

U.S. PATENT DOCUMENTS

| | | | |
|---|---|---|---|
| 5,736,791 | A | 4/1998 | Fujiki et al. |
| 2005/0001324 | A1 | 1/2005 | Dunn et al. |

(Continued)

FOREIGN PATENT DOCUMENTS

| | | |
|---|---|---|
| JP | H 11-126790 A | 5/1999 |
| JP | 2002-016069 A | 1/2002 |
| JP | 2010-050177 A | 3/2010 |

OTHER PUBLICATIONS

Extended European Search Report dated Nov. 24, 2017 in European Application No. 17177976.2.

*Primary Examiner* — Kevin M Picardat
(74) *Attorney, Agent, or Firm* — McGinn I.P. Law Group, PLLC

(57) ABSTRACT

A bonding pad of a semiconductor chip in a QFP includes, in its exposed portion, a via disposition area comprising: a first segment that connects a corner and a first point; a second segment that connects the corner and a second point; and an arc that connects the first point and the second point and forms a convex shape toward the corner. Further, in a plan view of the bonding pad, at least a part of a via is disposed so as to overlap with the via disposition area.

19 Claims, 20 Drawing Sheets

(51) Int. Cl.
    *H01L 23/13*     (2006.01)
    *H01L 23/31*     (2006.01)
    *H01L 23/00*     (2006.01)

(52) U.S. Cl.
    CPC ........... *H01L 2224/45147* (2013.01); *H01L 2224/48091* (2013.01); *H01L 2224/48247* (2013.01); *H01L 2224/48463* (2013.01); *H01L 2224/48465* (2013.01); *H01L 2224/49113* (2013.01); *H01L 2224/73265* (2013.01); *H01L 2924/181* (2013.01)

(56) References Cited

U.S. PATENT DOCUMENTS

| | | | |
|---|---|---|---|
| 2008/0217786 A1* | 9/2008 | Kasaoka | G03F 1/32 257/773 |
| 2011/0024744 A1 | 2/2011 | Fereyre et al. | |
| 2013/0062742 A1 | 3/2013 | Warren et al. | |
| 2015/0115269 A1 | 4/2015 | Ishii et al. | |
| 2015/0333010 A1* | 11/2015 | Zinn | H01L 24/05 257/753 |
| 2016/0163666 A1* | 6/2016 | Yajima | H01L 24/08 257/773 |

* cited by examiner

FIG. 26

| | FIRST EMBODIMENT (REPRESENTATIVE VALUE) | FIRST EMBODIMENT (RANGE) | SECOND EMBODIMENT (REPRESENTATIVE VALUE) | SECOND EMBODIMENT (RANGE) |
|---|---|---|---|---|
| | | | | [μm] |
| VIA DIMENSION (LENGTH OF ONE SIDE) | 30 | 10~50 | 3 | 1~5 |
| RECESS DIMENSION (LENGTH OF ONE SIDE) | 15 | 5~40 | 2 | 0.5~4 |
| RECESS DEPTH | 5 | 1~10 | 1 | 0.5~1.5 |
| RADIUS OF WIRE BALL | 40 | 30~80 | 20 | 15~40 |
| OPENING DIMENSION OF INSULATING FILM | 120 | 70~200 | 55 | 40~100 |

SEMICONDUCTOR DEVICE

CROSS-REFERENCE TO RELATED APPLICATION

The present application claims priority from. Japanese Patent Application No. 2016-126931 filed on Jun. 27, 2016 the content of which is hereby incorporated by reference into this application.

TECHNICAL FIELD OF THE INVENTION

The present invention relates to a semiconductor device including an electrode pad to which a conductive wire is connected, for example.

BACKGROUND OF THE INVENTION

With progress of miniaturization and cost reduction of semiconductor devices, miniaturization of a structure near electrode pads of semiconductor chips is also desired. Meanwhile, the number of electrode pads tends to increase due to multi-functionalization of the semiconductor devices.

In recent years, often used is a structure in which a lower layer wiring in a semiconductor chip and an electrode pad are electrically connected together through a via.

Incidentally, the structure in which the electrode pad of the semiconductor chip and the lower layer wiring are electrically connected through the via is disclosed in, for example, Japanese Patent Application Laid-open No. 2002-16069 (Patent Document 1) and Japanese Patent Application Laid-open No. 11-126790 (Patent Document 2).

SUMMARY OF THE INVENTION

As in the semiconductor device described above, in the structure in which the electrode pad and the lower layer wiring are electrically connected through the via, it is necessary to increase a via diameter in order to reduce resistance at a via portion. In addition, a recess (level difference, depression) is formed on the surface of the electrode pad on the via due to influence of coatability of sputter. If the wire bonding is performed on an area of the electrode pad on which the recess is formed, connection strength of wire bonding cannot be secured. As a countermeasure against this, therefore, it can be considered to draw out and dispose the via by using a lead wiring at a position outside an opening of an insulating film that defines the electrode pad.

However, since this structure brigs an increase in an area near the electrode pad, the miniaturization of the semiconductor chip cannot be achieved, and consequently the miniaturization of the semiconductor device cannot be achieved.

Other objects and novel characteristics of the present invention will be apparent from the description of the present specification and the accompanying drawings.

A semiconductor device according to one embodiment comprises: a semiconductor chip having an electrode pad; and a conductive wire including a wire connection portion electrically connected to the electrode pad. And, the semiconductor chip includes: a lower layer wiring formed in a lower layer of the electrode pad; a first insulating film that covers the lower layer wiring; a conductor connection portion that is disposed on the lower layer wiring, embedded in a first opening formed in the first insulating film, and is electrically connected to the lower layer wiring; and a second insulating film that covers a part of the electrode pad and on which a second opening that defines an exposed portion of the electrode pad is formed. Additionally, the electrode pad and the conductor connection portion are formed integrally. Additionally, the second opening includes: an intersection at which a first imaginary line along one side of two adjacent sides and a second imaginary line along the other side intersect each other; a first point on the first imaginary line positioned at a distance of a radius in a plan view of the wire connection portion from the intersection; and a second point on the second imaginary line positioned at the distance of the radius from the intersection. Further, the second opening includes a first area having: a first segment that connects the intersection and the first point; a second segment that connects the intersection and the second point; and an arc that connects the first point and the second point and forms a convex shape toward the intersection. Additionally, the wire connection portion is connected to a second area different from the first area in the second opening of the electrode pad, and at least a part of a recess formed in a surface of the electrode pad on the conductor connection portion overlaps with the first area in a plan view.

Additionally, another semiconductor device according to one embodiment comprises: a semiconductor chip having an electrode pad; and a conductive wire including a wire connection portion electrically connected to the electrode pad. And, the semiconductor chip includes: a lower layer wiring formed in a lower layer of the electrode pad; a first insulating film that covers the lower layer wiring; a conductor connection portion that is disposed on the lower layer wiring, embedded in a first opening formed in the first insulating film, and is electrically connected to the lower layer wiring; and a second insulating film that covers a part of the electrode pad and on which a second opening that defines an exposed portion of the electrode pad is formed. Additionally, the electrode pad and the conductor connection portion are integrally formed. Then, the second opening includes: a first side and a second side that forma corner; a first point on the first side positioned at a distance of a radius in a plan view of the wire connection portion from the corner; and a second point on the second side positioned at the distance of the radius from the corner, and includes a first area having: a first segment that connects the corner and the first point; a second segment that connects the corner and the second point; and an arc that connects the first point and the second point and forms a convex shape toward the corner. Further, the wire connection portion is connected to a second area different from the first area in the second opening of the electrode pad, and at least a part of a recess formed on a surface of the electrode pad on the conductor connection portion overlaps with the first area in a plan view.

According to one embodiment described above, size reduction of the semiconductor chip can be achieved, and the miniaturization of the semiconductor device can be achieved.

BRIEF DESCRIPTION OF THE DRAWINGS

FIG. 26 is a data diagram illustrating an example of respective values about a pad structure in a third embodiment;

DESCRIPTIONS OF THE PREFERRED EMBODIMENTS

Figure 1:
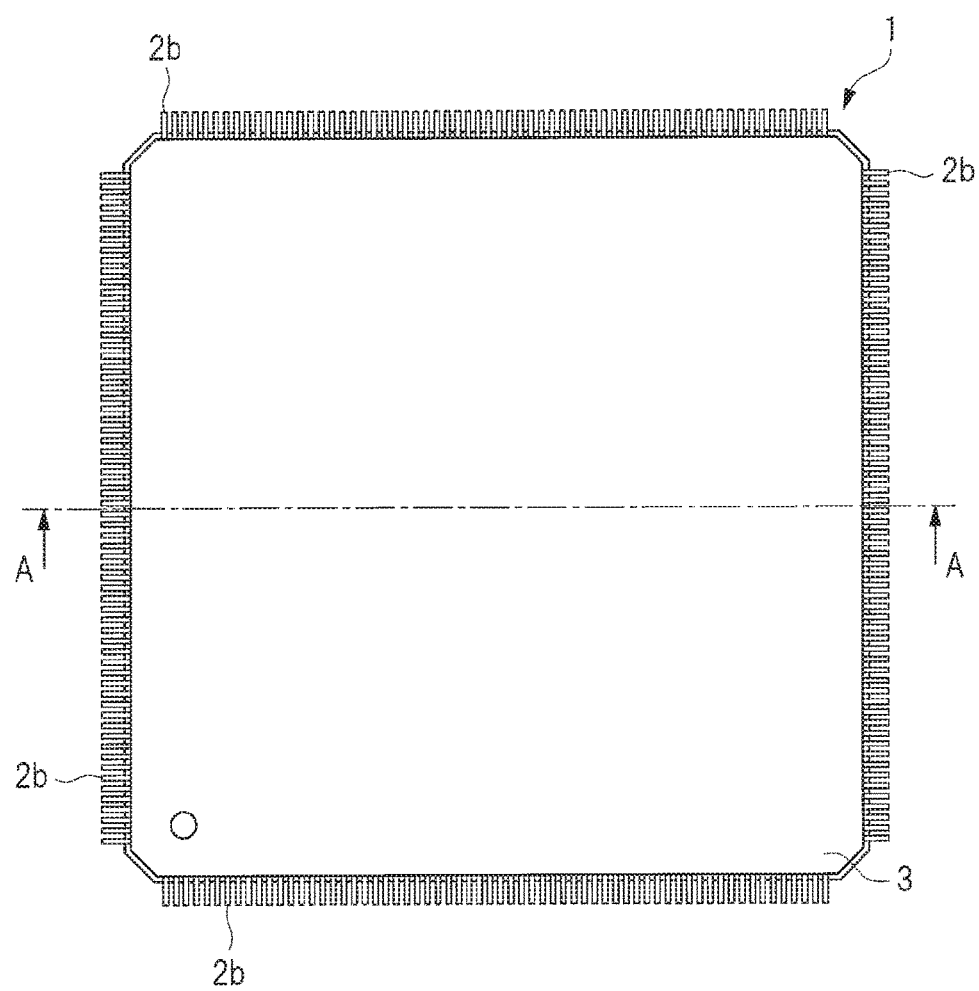
FIG. 1 is a plan view illustrating an example of a structure of a semiconductor device according to a first embodiment.

The description of the same or similar portions is not repeated in principle unless particularly required in the following embodiments.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like are "made of A" or "made up of A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Incidentally, components having the same function are denoted by the same reference characters throughout the drawings for describing the embodiments, and the repetitive description thereof is omitted.

First Embodiment

<Structure of Semiconductor Device>

Figure 2:
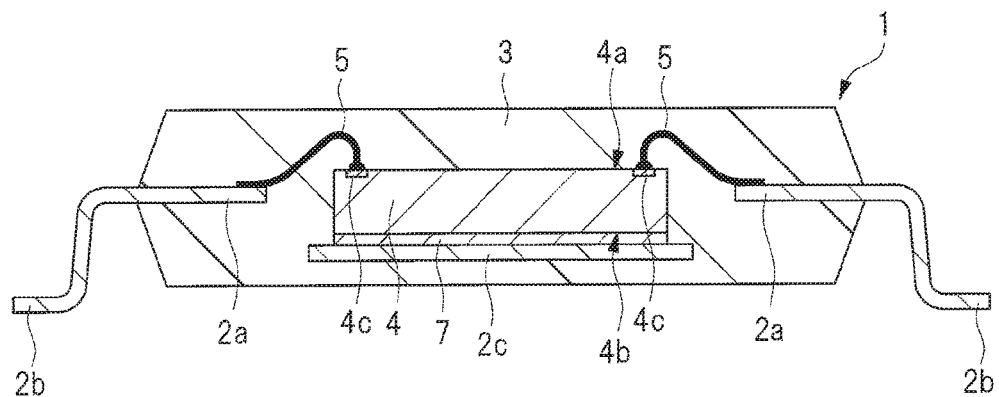
FIG. 2 is a cross-sectional view illustrating a structure taken along a line A-A illustrated in FIG. 1.

FIG. 1 is a plan view illustrating an example of a structure of a semiconductor device according to a first embodiment, and FIG. 2 is a cross-sectional view illustrating a structure taken along a line A-A illustrated in FIG. 1.

The semiconductor device of the first embodiment illustrated in FIG. 1 is a semiconductor package assembled through wire bonding to an electrode pad of a semiconductor chip, and a quad flat package (QFP) 1 will be described as an example of the semiconductor device, in the first embodiment.

A configuration of the QFP 1 illustrated in FIGS. 1 and 2, the QFP 1 is explained so as to include: a semiconductor chip 4 on which a semiconductor integrated circuit is formed; a plurality of inner leads 2a radially disposed around the semiconductor chip 4; and a plurality of outer leads 2b formed integrally with the respective inner leads 2a. In addition, the QFP 1 includes: bonding pads 4c that are electrode pads exposed on a principal surface 4a of the semiconductor chip 4; and a plurality of wires (conductive wires) 5 that electrically connect the bonding pads 4c and the respective inner leads 2a corresponding to them.

Further, the QFP 1 includes: a tab (die pad) 2c that is a chip mounting part fixed to the semiconductor chip 4 through a die bonding material 7 such as silver paste; and a sealing body 3 that is formed from a sealing resin etc. with resin molding and seals the semiconductor chip 4, the tab 2c, the plurality of wires 5, and the plurality of inner leads 2a. Since such a structure is a part of the QFP 1, the plurality of outer leads 2b respectively formed integrally with the plurality of inner leads 2a protrude externally from four sides of the sealing body 3, and each of the outer leads 2b is bent and formed into a gull wing shape.

Here, the inner leads 2a, the outer leads 2b, and the tab 2c are formed by a thin plate member of an iron-nickel alloy, a copper alloy, for example, and the sealing body 3 is made of a resin material such as a thermosetting epoxy resin and formed through resin molding.

In addition, the semiconductor chip 4 is formed of silicon etc., for example, and is fixed with the die bonding material 7 on the tab 2c, and the semiconductor integrated circuit is formed on its principal surface 4a. That is, a back surface 4b of the semiconductor chip 4 and an upper surface of the tab 2c are bonded through the die bonding material 7.

<Structure of Electrode Pad>

Figure 3:
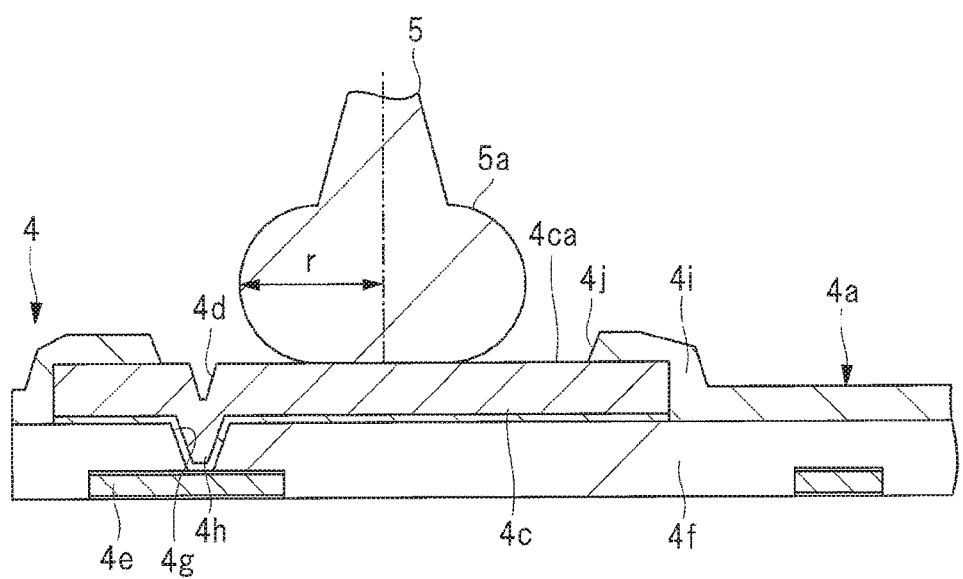
FIG. 3 is an enlarged partial cross-sectional view illustrating an example of a basic structure of an essential part of the semiconductor device of FIG. 1.
Figure 4:
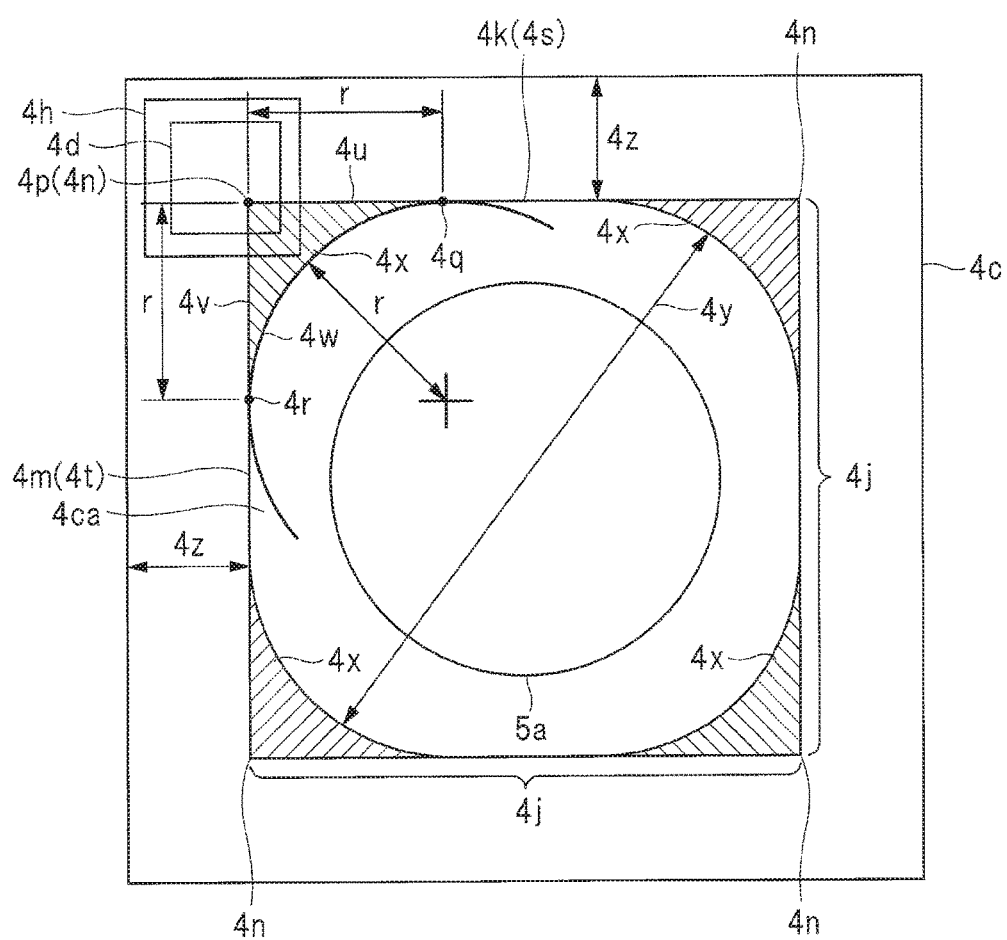
FIG. 4 is a plan view illustrating an example of a basic structure of a pad illustrated in FIG. 3.

FIG. 3 is an enlarged partial cross-sectional view illustrating an example of a basic structure of an essential part in the semiconductor device of FIG. 1, and FIG. 4 is a plan view illustrating an example of a basic structure of a pad illustrated in FIG. 3.

Described will be a basic structure of an electrode pad in the QFP 1 of the first embodiment with reference to FIGS. 3 and 4. As illustrated in FIG. 3, the semiconductor chip 4 includes the bonding pads 4c that are the plural electrode pads exposed on the principal surface 4a, and a wire 5 is connected to each of the bonding pads 4c by thermocompression through wire bonding. That is, a wire ball (wire connection portion) 5a having a tip of the wire 5 formed into a ball shape is electrically connected to the bonding pad 4c.

In addition, in the semiconductor chip 4, a lower layer wiring 4e is formed in a lower layer of the bonding pad 4c, and the lower layer wiring 4e is covered by an insulating film (first insulating film) 4f disposed in the lower layer of the bonding pad 4c.

In addition, formed on the lower layer wiring 4e is a via (conductor connection portion) 4h that is embedded in an opening (first opening) 4g formed in the insulating film 4f and is electrically connected to the lower layer wiring 4e. Incidentally, the bonding pad 4c and the via 4h are integrally formed. That is, the bonding pad 4c and the via 4h are integrally formed by the same material.

In addition, a part of the bonding pad 4c is covered by an insulating film (second insulating film) 4i. In the insulating film 4i, an opening (second opening) 4j that defines an exposed portion 4ca of the bonding pad 4c is formed. That is, the exposed portion 4ca of the bonding pad 4c is defined, in a plan view, by a shape of the opening 4j formed in the insulating film 4i that covers the part of the bonding pad 4c. In a case of the first embodiment, as illustrated in FIG. 4, the opening 4j of the insulating film 4i forms a substantially square in a plan view, and the shape of the opening 4j just corresponds to the shape of the exposed portion 4ca of the bonding pad 4c. Accordingly, the exposed portion 4ca of the bonding pad 4c and the opening 4j of the insulating film 4i have the same shape in a plan view, and this shape in the first embodiment is substantially square.

In addition, as illustrated in FIG. 3, a recess 4d (level difference, depression) is formed in a surface of the bonding pad 4c on the via 4h. When a conductor is embedded in the via opening 4g in forming the conductor integrally with the bonding pad 4c and the via 4h by sputtering or the like, the recess 4d is formed by a phenomenon (influence due to coatability of sputter) in which the upper surface of the bonding pad 4c is recessed.

Next, description will be made for a wire ball disposition area (second area) 4y in the exposed portion 4ca of the bonding pad 4c in the first embodiment illustrated in FIG. 4 and a via disposition area (first area, hatching area illustrated in FIG. 4) 4x positioned outside the wire ball disposition area 4y.

As illustrated in FIGS. 3 and 4, the exposed portion 4ca by the substantially square opening 4j of the insulating film 4i is formed on the bonding pad 4c. The substantially square exposed portion 4ca is divided into the wire ball disposition area 4y, in which the wire ball 5a can be disposed, and the via disposition area 4x outside the wire ball disposition area 4y. The via disposition area 4x is positioned at each of four corners of the substantially square exposed portion 4ca.

Here, a method for defining the via disposition area 4x is explained so that the opening 4j first includes an intersection 4p at which a first imaginary line 4s along a first side 4k and a second imaginary line 4t along a second side 4m intersect each other. The first side 4k is one side of two adjacent sides, and the second side 4m is the other side thereof. Further, the opening 4j includes a first point 4q on the first imaginary line 4s positioned at a distance of a radius r in a plan view of the wire ball 5a from the intersection 4p, and a second point 4r on the second imaginary line 4t positioned at a distance of the radius r from the intersection 4p.

The via disposition area 4x includes: a first segment 4u that connects the intersection 4p and the first point 4q; a second segment 4v that connects the intersection 4p and the second point 4r; and an arc 4w that connects the first point 4q and the second point 4r and forms a convex shape toward the intersection 4p. That is, the via disposition area 4x formed at each of four corners of the substantially square exposed portion 4ca is an area formed by the first segment 4u having the distance r, the second segment 4v having the same distance r, and the arc 4w.

Meanwhile, the wire ball disposition area 4y is an area other than the four (four corners) via disposition areas 4x in the substantially square exposed portion 4ca of the bonding pad 4c, and is an area positioned inside each of the four via disposition areas 4x. The wire 5 is connected to the wire ball disposition area 4y different from the via disposition areas 4x. That is, the wire ball 5a is connected to the wire ball disposition area 4y. At this time, the wire ball 5a does not enter the via disposition area 4x.

In the semiconductor device of the first embodiment, at least a part of the recess 4d, which is formed on the via 4h and is formed in the surface of the bonding pad 4c, is formed in the via disposition area 4x. That is, in a plan view, at least a part of the recess 4d having a substantially square overlaps with the via disposition area 4x.

In the pad structure illustrated in FIG. 4, in a plan view, each part of the recess 4d and the via 4h each having a substantially square is formed across the via disposition area 4x and an insulating film area 4z in which the insulating film 4i illustrated in FIG. 3 outside the exposed portion 4ca (via disposition area 4x) is formed. That is, the respective parts of the recess 4d and the via 4h overlap with both areas of the via disposition area 4x and the insulating film area 4z outside the via disposition area 4x.

Next, in the pad structure illustrated in FIG. 4, a method for defining the via disposition area 4x will be described in a case where the exposed portion 4ca of the bonding pad 4c is square in a plan view and there are four corners 4n in the exposed portion 4ca.

In this case, the opening 4j includes: the first side 4k and the second side 4m that form the corner 4n; the first point 4q on the first side 4k positioned at the distance of the radius r in a plan view of the wire ball 5a from the corner 4n; and the second point 4r on the second side 4m positioned at the distance of the radius r from the corner 4n.

Further, the opening 4j includes: the via disposition area 4x including the first segment 4u that connects the corner 4n and the first point 4q; the second segment 4v that connects the corner 4n and the second point 4r; and the arc 4w that connects the first point 4q and the second point 4r and forms a convex shape toward the corner 4n. That is, the opening 4j has the four via disposition areas 4x each including: the first segment 4u having the length r from the corner 4n; the second segment 4v having the length r from the corner 4n; and the arc 4w.

In other words, the via disposition area 4x is an area enclosed by: two sides (first side 4k and second side 4m) each extending from the corner 4n of the opening 4j to the length of the radius r of the wire ball 5a; and the arc 4w of the radius r of the wire ball 5a having a convex shape toward the corner 4n of the opening 4j.

In a plan view, all or a part of a planar shape of the via 4h is disposed in the via disposition area 4x, and the wire ball 5a is disposed in the wire ball disposition area 4y different from the via disposition area 4x. Therefore, the wire ball 5a does not need to contact with the recess 4d above the via 4h, a lead wiring is omitted and the wire ball 5a and the via 4h can be electrically connected.

Thus, the pad structure is miniaturized, and miniaturization of the semiconductor chip 4 and miniaturization of the semiconductor device (QFP 1) can be achieved.

In addition, the recess 4d formed right above the via 4h makes it possible to relax a shock of a chip in a horizontal direction during the wire bonding by deforming a metal portion of the bonding pad 4c in the horizontal direction.

As a result, by miniaturizing the semiconductor chip 4, connection reliability of the wire 5 to the bonding pad 4c can be improved.

Figure 5:
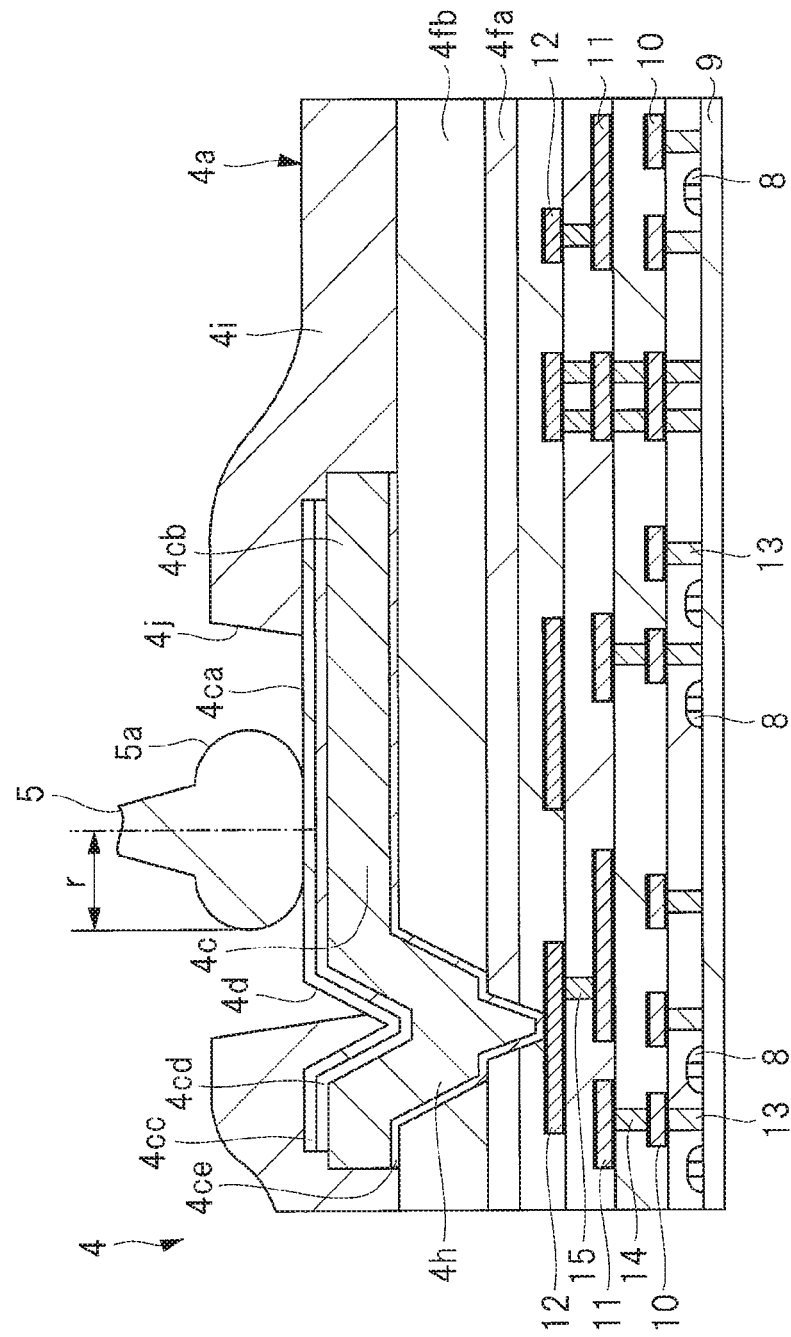
FIG. 5 is an enlarged partial cross-sectional view illustrating an example of a pad structure in the first embodiment.
Figure 6:
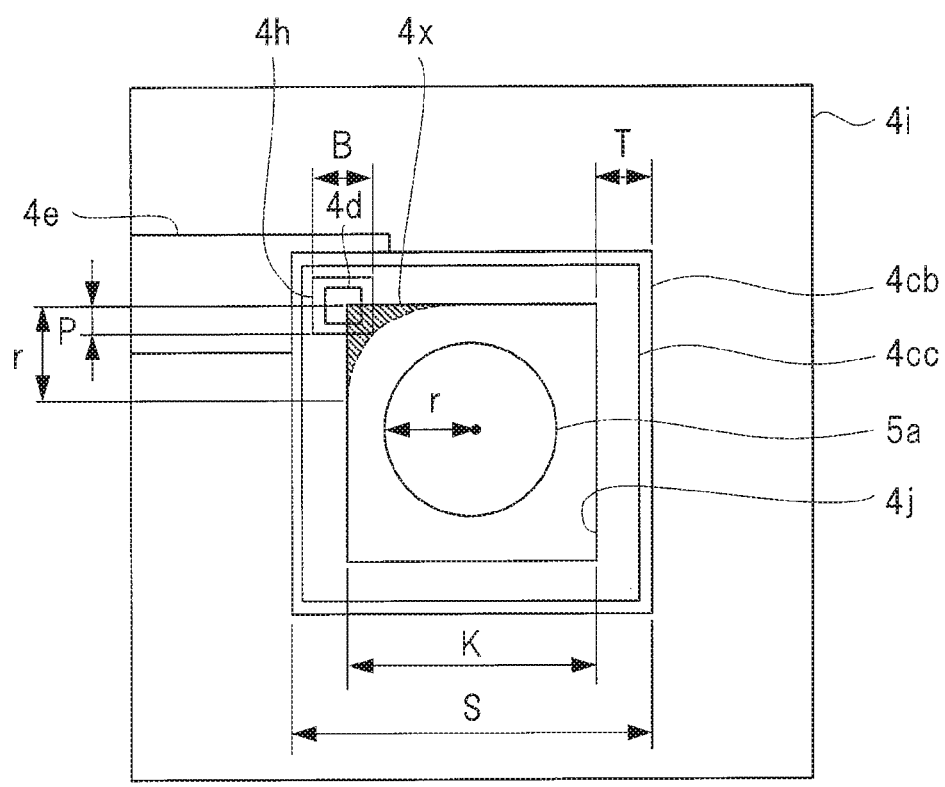
FIG. 6 is a plan view illustrating an example of the pad structure illustrated in FIG. 5.
Figure 7:
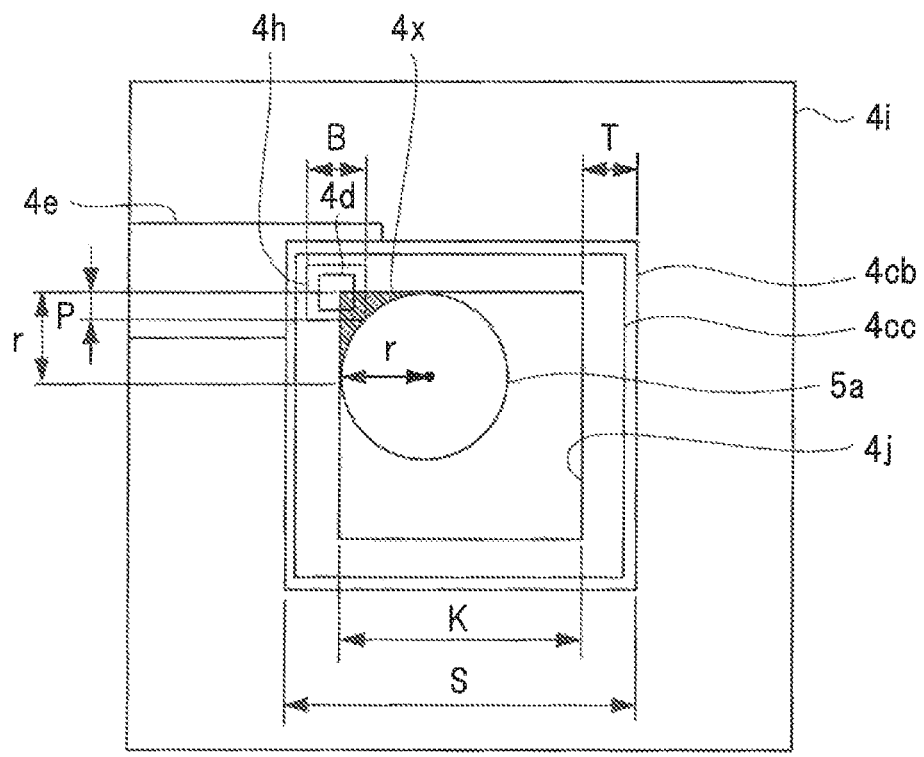
FIG. 7 is a plan view illustrating an example of the pad structure illustrated in FIG. 5.
Figure 8:
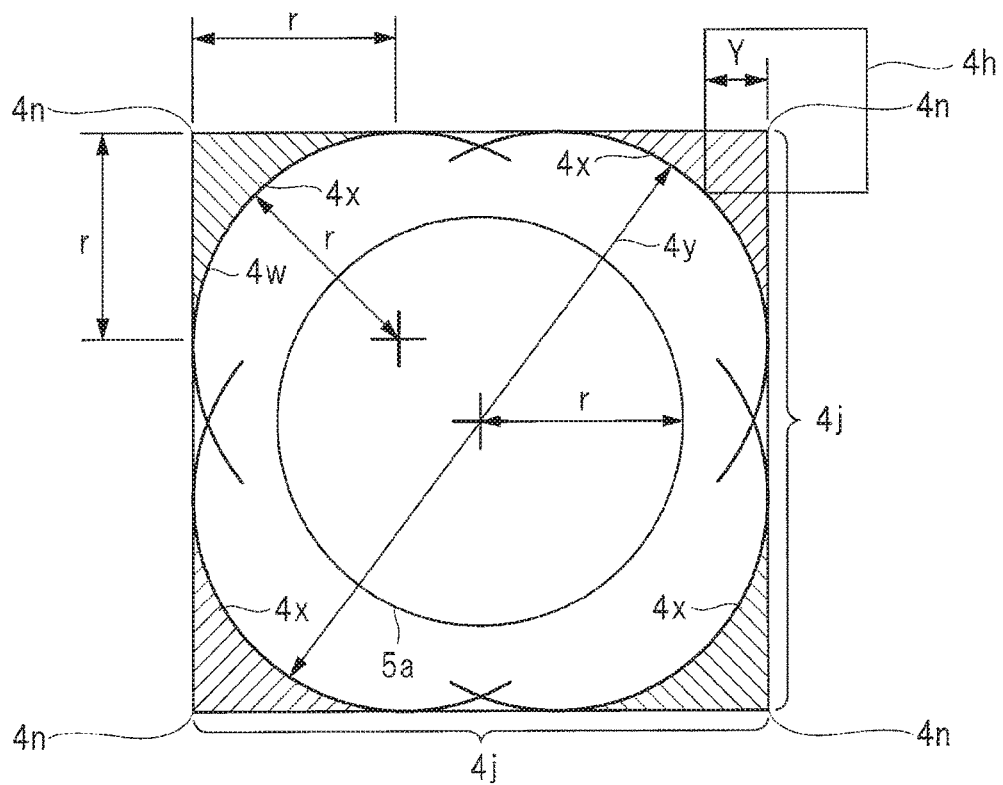
FIG. 8 is a plan view illustrating an example of a structure of an opening of a pad of the first embodiment.
Figure 9:
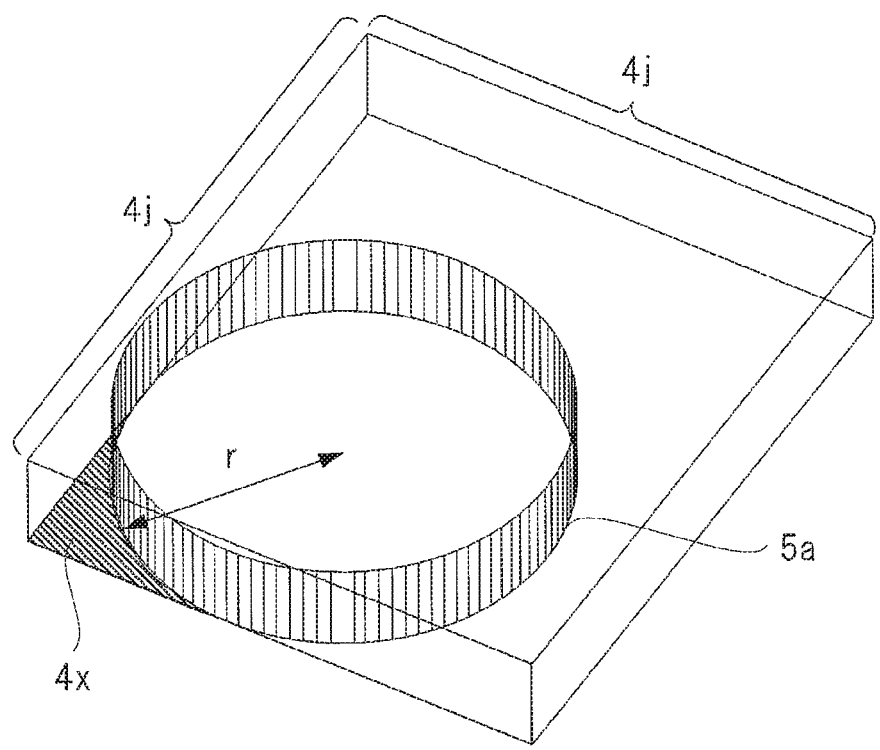
FIG. 9 is a perspective view illustrating an example of the pad structure illustrated in FIG. 8.

Next, described will be a specific example about the pad structure of the first embodiment using the basic structure of FIG. 3. FIG. 5 is an enlarged partial cross-sectional view illustrating an example of a pad structure in the first embodiment; FIG. 6 is a plan view illustrating an example of the pad structure illustrated in FIG. 5; FIG. 7 is a plan view illustrating an example of the pad structure illustrated in FIG. 5; FIG. 8 is a plan view illustrating an example of a structure of an opening of a pad in the first embodiment; and FIG. 9 is a perspective view illustrating an example of the pad structure illustrated in FIG. 8.

Here, described will be a structure of a case where a rewiring 4cb is used as the bonding pad 4c.

The pad structure illustrated in FIG. 5 is explained so that transistors 8 are formed on a Si substrate 9, and the transistors 8 and first wirings 10 are connected by contact parts 13. In addition, the first wirings 10 and the second wirings 11 are connected by first vias 14. Further, the second wirings 11 and third wirings 12 are connected by second vias 15. In addition, the third wiring 12 and the rewiring 4cb are connected by the pad via (via 4h).

Incidentally, the pad via (via 4h) penetrates a moisture resistant insulating film 4fa and a lower layer insulating film 4fb. The pad via (via 4h) is formed integrally with the rewiring 4cb, and the recess 4d (level difference, depression) is formed above the via 4h.

Here, the rewiring 4cb is formed by an electroplating method or an electroless plating method, is made of a material containing copper as a main component, for example, and is a wiring having a relatively greater thickness of about from 5 to 6 µm. In this case, the exposed portion 4ca that is a part of the rewiring 4cb becomes the bonding pad 4c. In addition, since the rewiring 4cb has the greater thickness, the via 4h also has a relatively large size, and forms a square having a side of about 30 µm when its shape in a plan view is square.

In addition, the rewiring 4cb is a wiring of the uppermost layer, and is formed on the lower layer insulating film 4fb. A part of the rewiring 4cb is covered by the insulating film (second insulating film) 4i that is an upper layer insulating film. The exposed portion 4ca of the rewiring 4cb is exposed from the opening 4j of the insulating film 4i, and the bonding pad 4c to which the wire ball (wire connection portion) 5a formed at a tip of the wire 5 is connected is formed on the exposed portion 4ca. A part of an upper surface of the rewiring 4cb is opened, and an adhesion layer 4cc that improves adhesion properties with the wire 5 is formed on the surface of the bonding pad 4c. In other words, the adhesion layer 4cc is formed between the bonding pad 4c configured by the rewiring 4cb and the wire ball 5a, and is a gold layer, a palladium layer, or a nickel layer, for example.

In addition, a barrier layer 4cd may be formed between the rewiring 4cb and the adhesion layer 4cc, and a barrier layer 4ce may be formed under the rewiring 4cb. The barrier layer 4cd is a nickel layer, for example, and the barrier layer 4ce is a titanium layer, for example. That is, a structure and the number of the wiring layer configuring the rewiring 4cb are not particularly limited, and the rewiring 4cb may be formed by three kinds of metals, for example. Alternatively, the wire 5 may be connected directly to the surface of the rewiring 4cb.

Incidentally, the wire 5 is made of a material containing copper as a main component, for example.

Next, described will be a size (an example) of each component in a case of using the rewiring 4cb.

For example, when wire bonding is performed using the wire 5 with a radius of 20 µm, the radius r in a plan view of the wire ball (wire connection portion) 5a is 40 µm.

The disposition area (via disposition area 4x) of the pad via (via 4h) is an area enclosed by: the first segment 4u from the corner 4n of the opening 4j in the insulating film 4i to the first point 4q at 40 µm that is the same as the radius r of the wire ball 5a on the first side 4k; the second segment 4v from the corner 4n on the second side 4m to the second point 4r at the same distance; and the arc 4w that connects the first point 4q and the second point 4r and has a concave shape toward the corner 4n.

Here, described will be a method for calculating an overlapping length Y (see FIG. 8) with the via disposition area 4x of the pad via in a case of the pad via (via 4h) that is a square in a plan view.

As illustrated in FIGS. 8 and 9, the radius of the wire ball 5a is r, whereas the radius of the arc 4w is also r. In this case, as illustrated in FIG. 8, if it is assumed that a part of the via 4h that enters the via disposition area 4x is a square shape with a side length of Y (overlapping length), $Y = r - r/\sqrt{2} = r \times (1 - 1/\sqrt{2}) = 0.29r$. That is, the pad via (via 4h) having about 0.29 times the radius r of the wire ball 5a can be disposed (overlapped) inside (via disposition area 4x). In the first embodiment, if it is assumed that the radius r of the wire ball 5a is 40 μm, the pad via (via 4h) can be disposed inside by 11.6 μm. That is, as illustrated in FIG. 6, the pad via (via 4h) can be overlapped with the via disposition area 4x to a size of a square with a side (P) of 11.6 μm.

Incidentally, the pad via (via 4h) is preferably disposed in the via disposition area (first area) 4x, in a plan view. That is, the entirety of the pad via (via 4h) with a square shape preferably falls within the via disposition area (first area) 4x in a plan view.

In addition, in a case of the rewiring 4cb as described in the first embodiment, it is necessary to set a distance T between an end of the rewiring 4cb and the opening 4j of the insulating film 4i to 25 μm due to processing accuracy. That is, it is necessary to separate the end of the rewiring 4cb from an edge of the opening 4j in the insulating film 4i by 25 μm. Here, a length K of one side of the opening 4j is about 1.5 times the diameter of the wire ball 5a. Accordingly, when the radius r of the wire ball 5a is 40 μm, the length K of one side of the opening 4j is 120 μm, and further the distance T between the end of the rewiring 4cb and the opening 4j in the insulating film 4i is 25 μm, so that a size S of one side in a plan view of the rewiring 4cb becomes 170 μm.

In addition, in referring to the size of the via 4h (pad via) in a plan view (the length of one side of the square in a plan view) in the pad structure illustrated in FIG. 6, the size is represented by a length from one upper end of the opening of the via 4h (pad via) to the other upper end. For example, a size (length of one side) B of the via 4h illustrated in FIG. 6 is 30 μm.

From the above, in the pad structure using the rewiring 4cb illustrated in FIGS. 5 and 6, the square via 4h (pad via) with a side of 30 μm can be disposed without addition of the lead wiring.

Incidentally, due to the influence of positional accuracy at a time of the wire bonding, variation occurs in connection positions of the wire balls 5a. FIG. 7 illustrates a case where the connection position of the wire ball 5a varies in a direction toward the via 4h. Even when the connection position of the wire ball 5a varies in the direction toward the via 4h as illustrated in FIG. 7, a side wall of the opening 4j in the insulating film 4i inhibits the wire ball 5a from entering toward the via direction, so that the wire ball 5a does not enter into the via disposition area 4x. That is, the wire ball 5a can be prevented from being disposed on the recess 4d.

<Method for Manufacturing Electrode Pad>

FIGS. 10 to 23 are partial cross-sectional views each illustrating a part of a method for manufacturing the electrode pad using the rewiring of FIG. 5.

The method for manufacturing the electrode pad of the first embodiment will be described.

Figure 10:
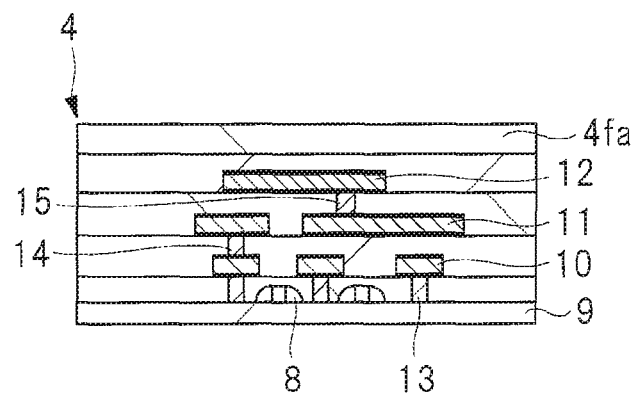
FIG. 10 is a partial cross-sectional view illustrating a part of a method for manufacturing the electrode pad of FIG. 5.

A structure in FIG. 10 illustrates a state in which the first wiring 10, the second wiring 11, and third wiring 12 have been formed, and then the moisture resistant insulating film 4fa has been formed on the third wiring 12. An oxide film, TEOS, SiOC, an organic insulating film, or the like is suitable right above the third wiring 12. Silicon nitride having high moisture resistance is suitable for the uppermost surface, and its surface is a moisture resistant insulating film 4fa.

Figure 11:
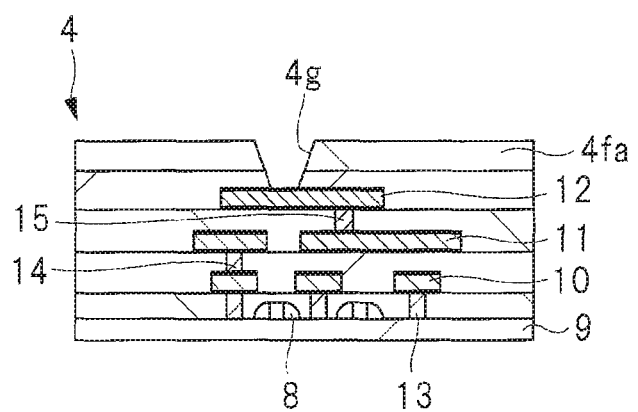
FIG. 11 is a partial cross-sectional view illustrating a part of the method for manufacturing the electrode pad of FIG. 5.

Next, a structure in FIG. 11 illustrates a state in which the opening 4g for the pad via (via 4h) has been formed in the moisture resistant insulating film 4fa. Here, a pattern is formed through a photolithography method using a photoresist, and then the opening 4g for the pad via is formed in the third wiring 12 through an anisotropic dry etching method.

Figure 12:
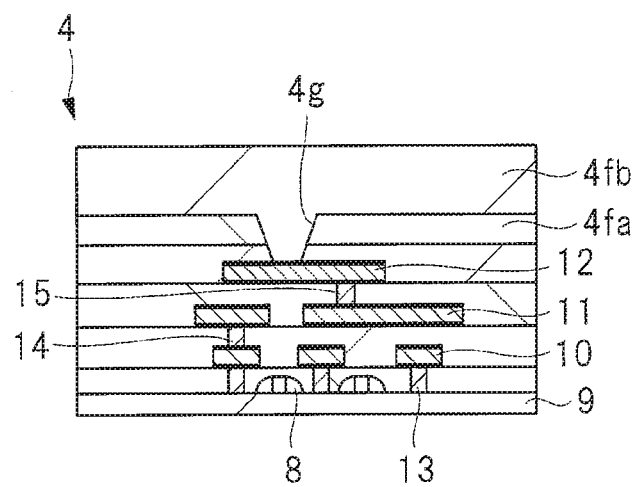
FIG. 12 is a partial cross-sectional view illustrating a part of the method for manufacturing the electrode pad of FIG. 5.

Next, a structure in FIG. 12 illustrates a state in which the lower layer insulating film 4fb is applied onto the moisture resistant insulating film 4fa. That is, the lower layer insulating film 4fb is applied on an area from on the moisture resistant insulating film 4fa to the opening 4g. Thus, the lower layer insulating film 4fb is formed on the moisture resistant insulating film 4fa, and the lower layer insulating film 4fb is embedded in the opening 4g. At this time, photosensitive polyimide is suitable for the lower layer insulating film 4fb.

Figure 13:
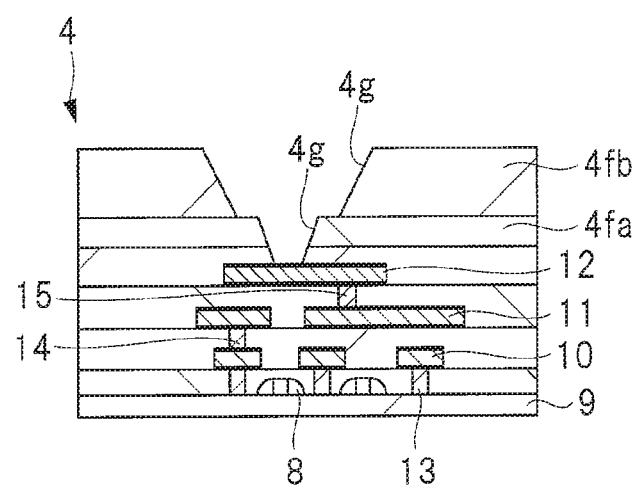
FIG. 13 is a partial cross-sectional view illustrating a part of the method for manufacturing the electrode pad of FIG. 5.

Next, a structure in FIG. 13 illustrates a state in which the lower layer insulating film 4fb has been pattern-formed through the photolithography method. Here, a desired area in the lower layer insulating film 4fb is removed in order to form the opening 4g for the pad via (via 4h). At that time, the opening 4g for the pad via (via 4h) is formed by exposing and developing the lower layer insulating film 4fb.

Figure 14:
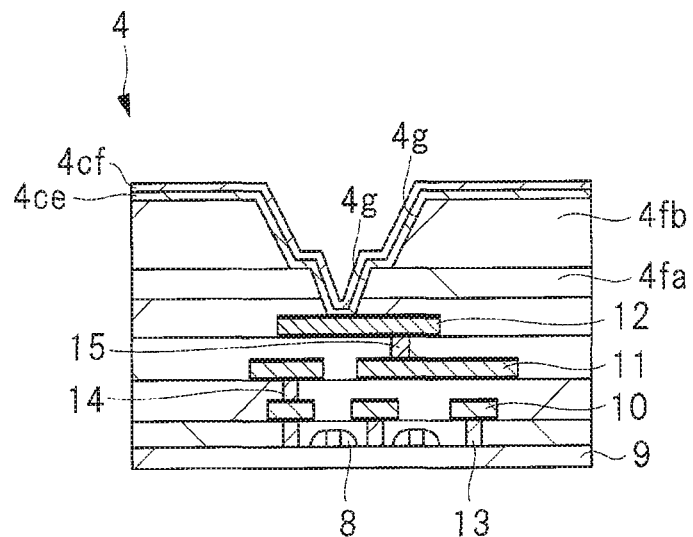
FIG. 14 is a partial cross-sectional view illustrating a part of the method for manufacturing the electrode pad of FIG. 5.

Next, a structure in FIG. 14 illustrates a state in which the barrier layer 4ce of the rewiring 4cb and a seed layer 4cf for plating have been formed on the lower layer insulating film 4fb so as to cover an entire surface of a wafer over. The seed layer 4cf is a metal layer to which a current for plating is applied. Incidentally, it is suitable to form both of the barrier layer 4ce and the seed layer 4cf through a sputter method or a chemical vapor deposition (CVD) method.

Here, titanium, titanium nitride, tantalum, tantalum nitride, chromium, and a laminated film thereof, for example, are suitable for the barrier layer 4ce of the rewiring 4cb. Meanwhile, copper, palladium, gold, silver, platinum, iridium, ruthenium, rhodium, titanium, aluminum, manganese, nickel, and an alloy or a laminated film thereof, for example, are suitable for the seed layer 4cf for plating.

Figure 15:
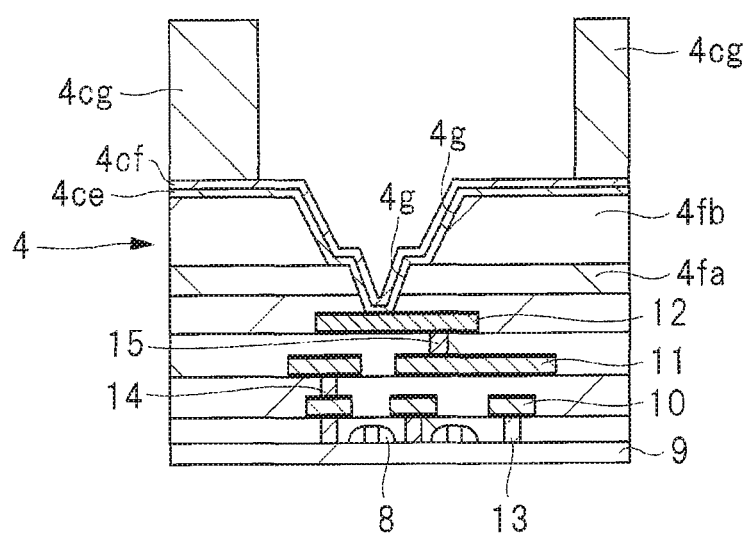
FIG. 15 is a partial cross-sectional view illustrating a part of the method for manufacturing the electrode pad of FIG. 5.

Next, a structure in FIG. 15 illustrates a state in which a photoresist 4cg has been applied onto the seed layer 4cf, and a pattern of a rewiring layer has been formed through the photolithography method. Here, the photoresist 4cg in an area that forms the rewiring 4cb is selectively removed through the photolithography method, and is opened so that the seed layer 4cf is exposed.

Figure 16:
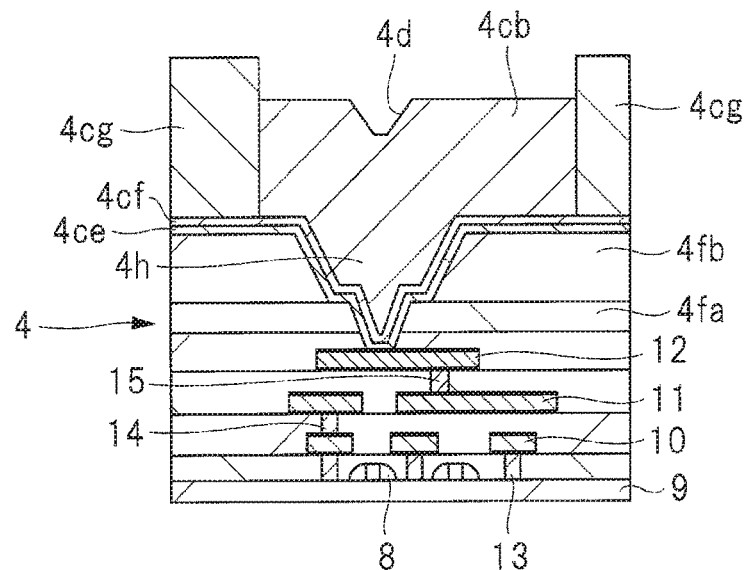
FIG. 16 is a partial cross-sectional view illustrating a part of the method for manufacturing the electrode pad of FIG. 5.

Next, a structure in FIG. 16 illustrates a state in which the rewiring 4cb has been formed in the opening of the photoresist 4cg. Copper, palladium, gold, silver, platinum, iridium, ruthenium, rhodium, titanium, aluminum, manganese, nickel, and an alloy or a laminated film thereof are suitable for metal configuring the rewiring 4cb. In the pad structure illustrated in FIG. 5, however, a case of using copper has been described as an example. Incidentally, an electroplating method, or an electroless plating method is suitable for forming the rewiring 4cb.

Incidentally, at this time, a plating film does not completely fill on and above the pad via (via 4h), and so the recess (level difference, depression) 4d remains.

Figure 17:
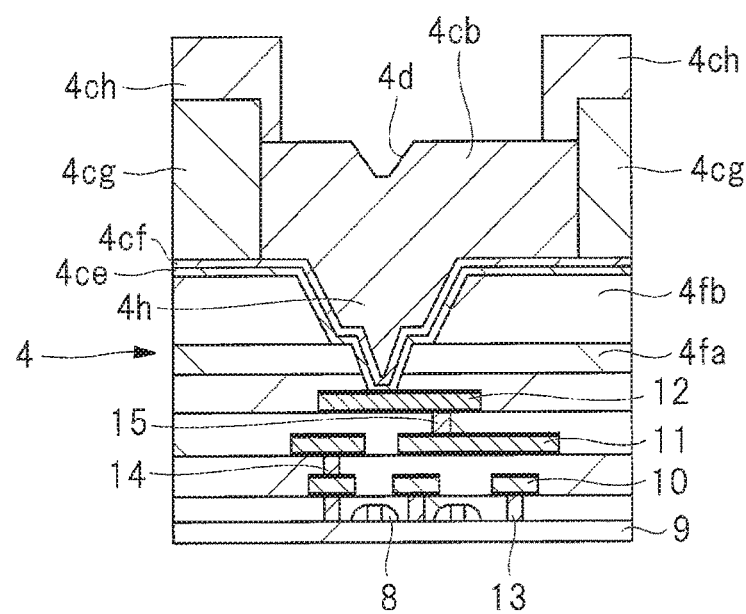
FIG. 17 is a partial cross-sectional view illustrating a part of the method for manufacturing the electrode pad of FIG. 5.

Next, a structure in FIG. 17 illustrates a state in which the photoresist 4ch has been applied onto the rewiring 4cb and the photoresist 4cg of the rewiring 4cb, and an opening for a bonding pad layer (adhesion layer) has been pattern-formed through the photolithography method. In this way, since the photoresist 4cg of the rewiring 4cb is left, the photoresist 4ch can be uniformly applied and manufacturing cost can be reduced even when the photoresist 4ch of the bonding pad layer has a small film thickness.

Figure 18:
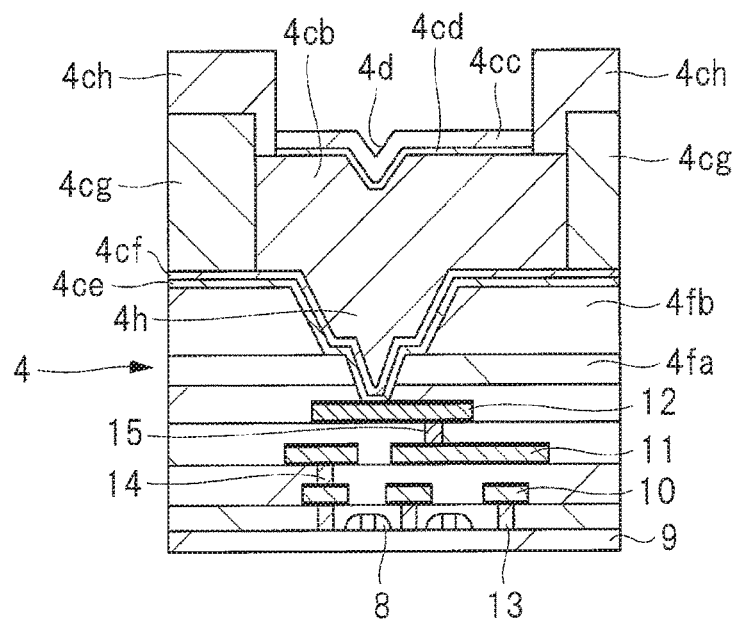
FIG. 18 is a partial cross-sectional view illustrating a part of the method for manufacturing the electrode pad of FIG. 5.

Next, a structure in FIG. 18 illustrates a state in which the barrier layer 4cd and the adhesion layer 4cc have been formed in an opening of the photoresist 4ch. Incidentally, palladium, gold, silver, platinum, iridium, ruthenium, rhodium, titanium, and an alloy or a laminated film thereof, for example, are suitable for the adhesion layer 4cc. In the pad structure illustrated in FIG. 5, a case of using gold has been described as an example.

Meanwhile, nickel, titanium, tantalum, chromium, and an alloy or a laminated film thereof, for example, are suitable for the barrier layer 4cd. In the pad structure illustrated in FIG. 5, a case of using nickel has been described as an example. Incidentally, the barrier layer 4cd is not necessarily formed. In addition, electroplating or electroless plating is suitable for forming the barrier layer 4cd and the adhesion layer 4cc.

Figure 19:
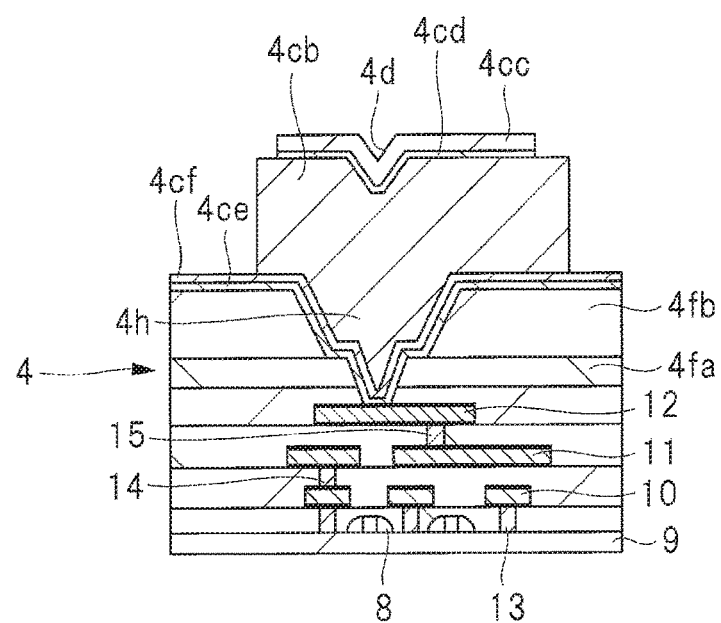
FIG. 19 is a partial cross-sectional view illustrating a part of the method for manufacturing the electrode pad of FIG. 5.

Next, a structure in FIG. 19 illustrates a state in which the photoresists 4cg and 4ch of the rewiring 4cb and the bonding pad layer have been removed. An organic acid, an organic solvent, or the like is suitable for removing the photoresists 4cg and 4ch. In this way, by leaving the photoresist 4cg of the rewiring 4cb, forming the photoresist 4ch thereon, forming the barrier layer 4cd and the adhesion layer 4cc, and thereafter removing the photoresists 4cg and 4ch, the photoresists 4cg and 4ch can be removed at once and manufacturing cost can be reduced.

Figure 20:
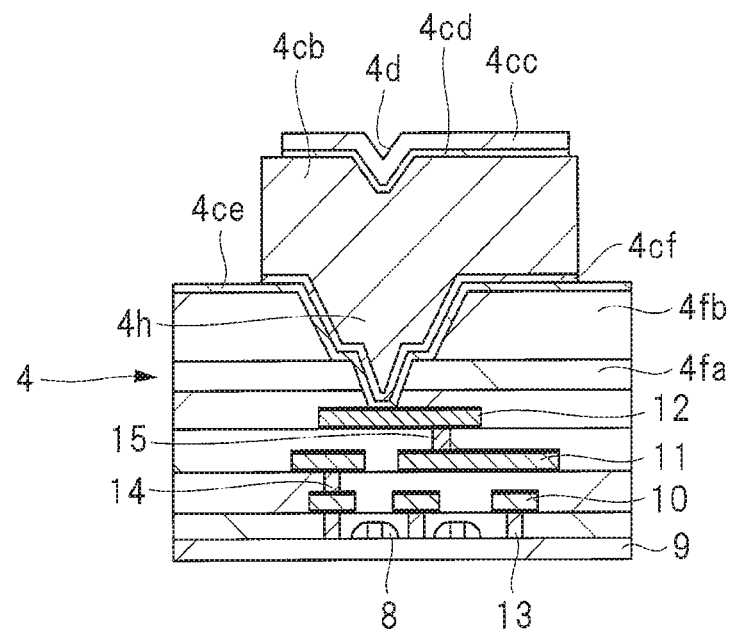
FIG. 20 is a partial cross-sectional view illustrating a part of the method for manufacturing the electrode pad of FIG. 5.

Next, a structure in FIG. 20 illustrates a state in which the seed layer 4cf around the rewiring 4cb has been removed. A mixed solution of sulfuric acid, hydrogen peroxide water, and water is suitable for removing the seed layer 4cf, and the seed layer 4cf is removed through wet etching by using the mixed solution. Thus, the seed layer 4cf is removed, and the barrier layer 4ce around the rewiring 4cb is exposed.

Figure 21:
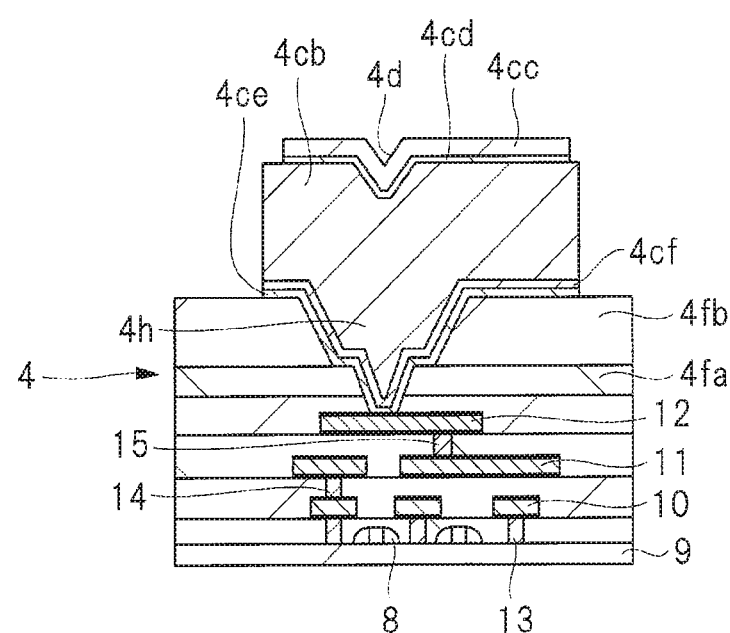
FIG. 21 is a partial cross-sectional view illustrating a part of the method for manufacturing the electrode pad of FIG. 5.

Next, a structure in FIG. 21 illustrates a state in which the barrier layer 4ce around the rewiring 4cb has been removed. A mixed solution of ammonia, hydrogen peroxide water, and water is suitable for removing the barrier layer 4ce around the rewiring 4cb, and the barrier layer 4ce is removed through wet etching by using the mixed solution. Thus, the barrier layer 4ce is removed, the lower layer insulating film 4fb is exposed, and as a result the rewiring 4cb becomes formed.

Figure 22:
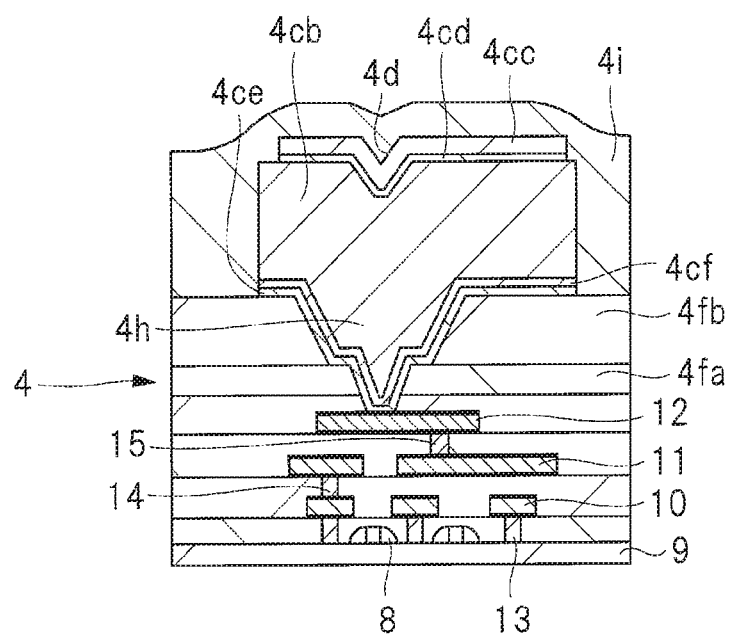
FIG. 22 is a partial cross-sectional view illustrating a part of the method for manufacturing the electrode pad of FIG. 5.

Next, a structure in FIG. 22 illustrates a state in which the insulating film 4i as the upper layer insulating film is applied onto the rewiring 4cb, the lower layer insulating film 4fb, and the moisture resistant insulating film 4fa. At this time, photosensitive polyimide is suitable for the insulating film 4i.

Figure 23:
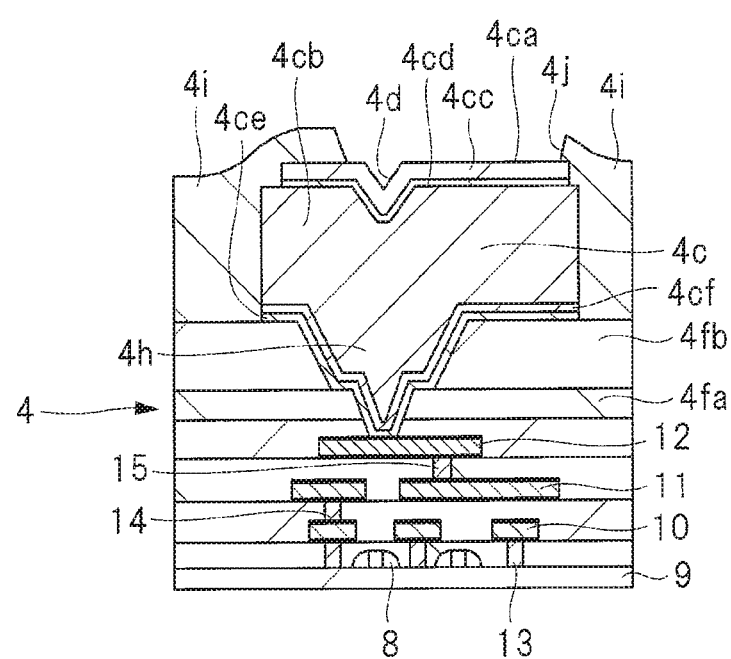
FIG. 23 is a partial cross-sectional view illustrating a part of the method for manufacturing the electrode pad of FIG. 5.

Next, a structure in FIG. 23 illustrates a state in which the insulating film 4i has been pattern-formed through the photolithography method. That is, the insulating film 4i over the bonding pad 4c is removed. Here, the insulating film 4i is removed by exposure and development, and then subjected to a heat treatment and polymerized. An opening of the bonding pad 4c is set on the adhesion layer 4cc.

From the above, formation of the bonding pad 4c configured by the rewiring 4cb is completed.

<Assembling of Semiconductor Device>

Assembly of the QFP 1 illustrated in FIGS. 1 and 2 will be described.

First, a die bonding process is performed. Here, the semiconductor chip 4 is mounted, through the die bonding material 7, on the tab 2c of a lead frame not illustrated. At this time, the semiconductor chip 4 is mounted on the tab 2c so that the principal surface 4a from which the bonding pad 4c of the semiconductor chip 4 is exposed faces upward.

Next, a wire bonding process is performed. The bonding pad 4c of the semiconductor chip 4 and the inner lead 2a of the lead frame are connected by the wire 5. At this time, on a semiconductor-chip side, the wire ball 5a formed at the tip of the wire 5 is connected into the wire ball disposition area 4y of the bonding pad 4c.

Next, a resin sealing process is performed. Here, the sealing body 3 is formed so that the tab 2c, the semiconductor chip 4, the inner leads, 2a and the plurality of wires 5 are covered by using a resin for molding and that the outer leads 2b are exposed.

Next, cutting and forming are performed. Here, the outer lead 2b is cut and separated from a frame portion of the lead frame, and the outer lead 2b is bent and formed into a gull wing shape. Thus, assembling of the QFP 1 is completed.

<Effects>

Figure 28:
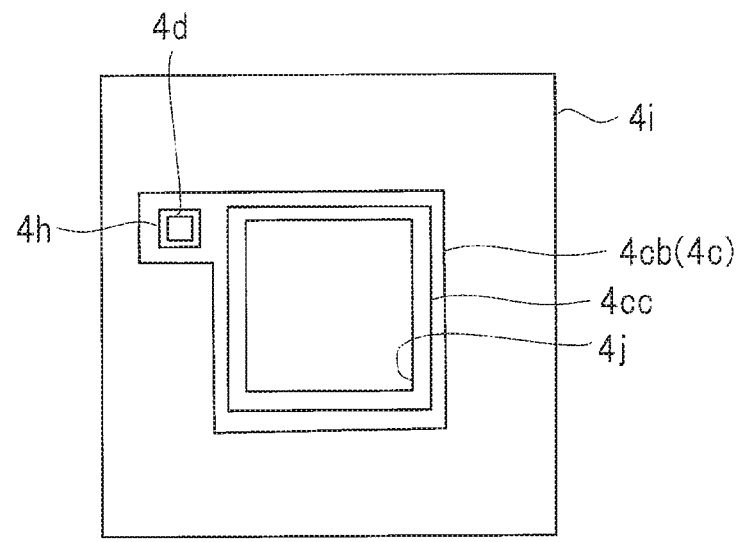
FIG. 28 is an enlarged partial plan view illustrating a pad structure as a comparative example.

In a pad structure on an enlarged partial plan view of a comparative example illustrated in FIG. 28 and studied by the inventors, since there is the recess 4d on the pad via (via 4h) in the rewiring 4cb that is the bonding pad 4c, if the pad via (via 4h) is disposed at a position of contacting (overlapping) with the wire ball 5a illustrated in FIG. 5, connection between the wire ball 5a and the adhesion layer 4cc becomes insufficient on the recess 4d, and connection failure of the wire 5 is caused. Accordingly, it can be considered that the via 4h is drawn out from and disposed outside the opening 4j in the insulating film 4i by using the lead wiring in order to prevent the connection failure of the wire 5 from being caused. In this case, however, the pad structure becomes large and, as a result, a chip area is expanded.

Therefore, in the QFP 1 of the first embodiment, by providing the insulating film 4i that is the upper layer insulating film, the pad via (via 4h) is disposed so that at least a part of the pad via (via 4h) overlaps with the via disposition area 4x formed by connecting: the corner 4n of the opening 4j in the insulating film 4i; the first point 4q at the same distance as the radius r of the wire ball 5a from the corner 4n; and the second point 4r at the same distance as the radius r from the corner 4n.

That is, in the exposed portion 4ca of the bonding pad 4c configured by the rewiring 4cb, the pad via (via 4h) is disposed so that at least a part of the pad via (via 4h) overlaps with the via disposition area 4x including: the first segment 4u that connects the corner 4n and the first point 4q; the second segment 4v that connects the corner 4n and the second point 4r; and the arc 4w that connects the first point 4q and the second point 4r and forms a convex shape toward the corner 4n. That is, in a plan view, at least a part of the pad via (via 4h) is disposed so as to overlap with the via disposition area 4x that is a part of the opening 4j of the bonding pad 4c, so that the lead wiring for drawing and disposing the via 4h outside the opening 4j is not used and reduction of the chip size can be achieved. As a result, miniaturization of the QFP 1 can be achieved.

In addition, reduction of the chip size can be achieved, so that cost reduction of the QFP 1 can be achieved.

Incidentally, the pad via (via 4h) is preferably disposed in the via disposition area (first area) 4x in a plan view. That is, the entire square pad via (via 4h) in a plan view preferably falls within the via disposition area (first area) 4x.

Thus, further reduction of the chip size can be achieved, and further miniaturization can be achieved in the size of the QFP 1.

In addition, even when the position of the wire ball 5a shifts in a direction of the pad via (via 4h), the wire ball 5a is blocked by the side wall of the insulating film 4i and cannot enter the pad via. As a result, in a plan view, the wire ball 5a and the pad via (via 4h) do not overlap each other, so that the connection failure in the wire bonding can be inhibited.

Thus, the connection reliability of the wire 5 in the QFP 1 can be improved.

Incidentally, at least a part in a plan view of the recess 4d formed right above the via overlaps with the via disposition area 4x, and so it can also be avoided that the recess 4d and the wire ball 5a overlap each other in a plan view.

In addition, the recess 4d is formed in the surface of the bonding pad 4c right above the via, so that a shock of a chip in a horizontal direction during the wire bonding can be absorbed by the recess 4d. That is, the recess 4d allows the metal portion of the bonding pad 4c to deform in the horizontal direction, so that disconnection of the wire 5 can be inhibited and the connection reliability of the wire 5 can be improved.

Incidentally, when the wire 5 is made of a material containing copper as a main component, since copper is relatively hard, a phenomenon called a splash in which the metal portion of the bonding pad 4c is pushed and scattered in the horizontal direction occurs in pressure-bonding the copper wire ball 5a to the bonding pad 4c, and the splash causes an electrical short circuit with the adjacent bonding pad 4c.

However, in the pad structure of the first embodiment, as described above, since the recess 4d is formed in the surface of the bonding pad 4c right above the via, the metal portion of the bonding pad 4c deforms in the horizontal direction, occurrence of the splash can be inhibited, and reduction of occurrence of electrical short circuit can be achieved.

Second Embodiment

Figure 24:
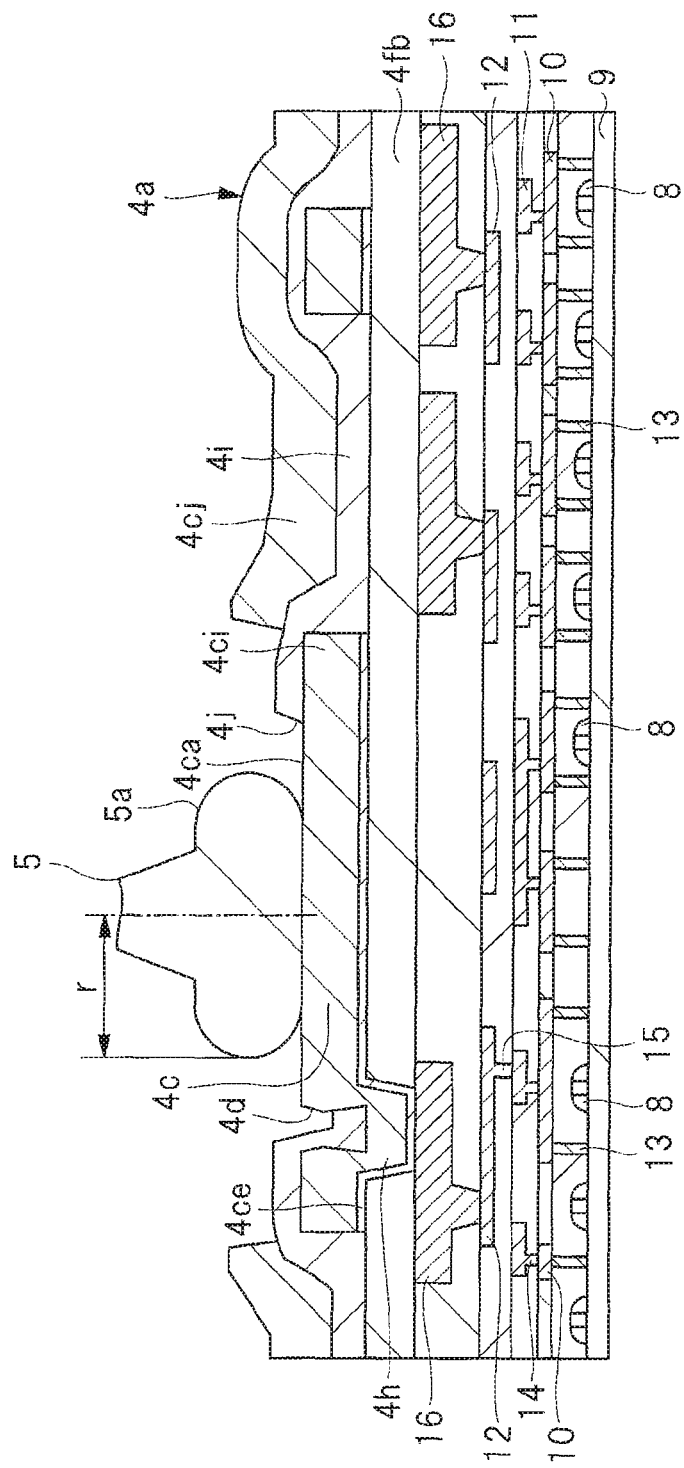
FIG. 24 is an enlarged partial cross-sectional view illustrating an example of a pad structure in a second embodiment.
Figure 25:
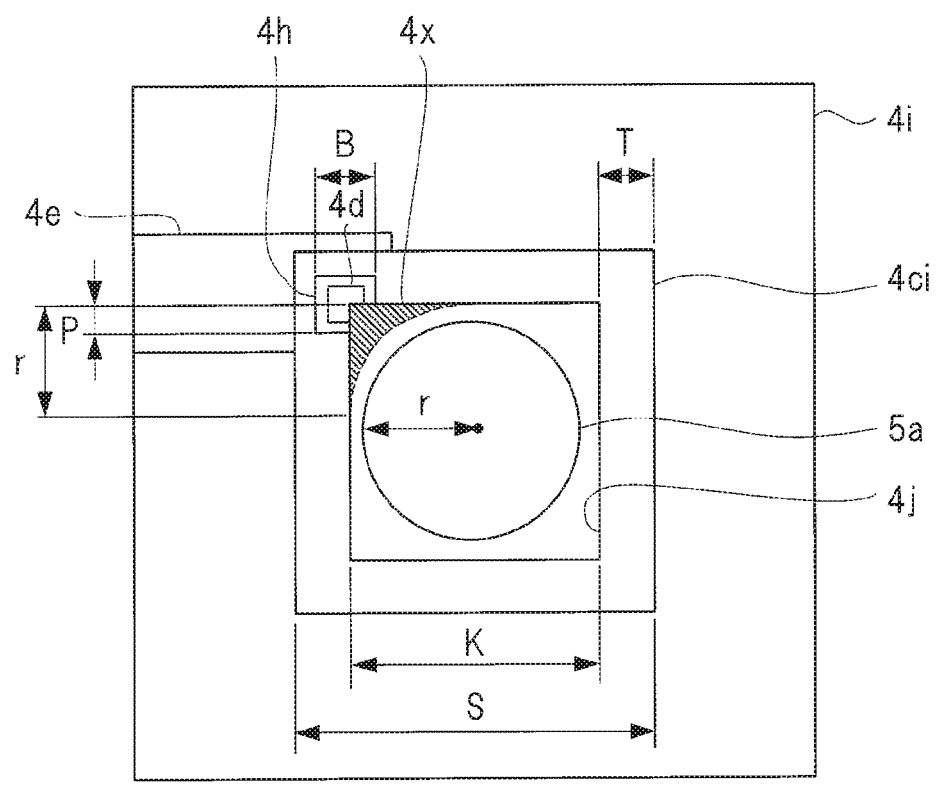
FIG. 25 is a plan view illustrating an example of the pad structure illustrated in FIG. 24.

FIG. 24 is an enlarged partial cross-sectional view illustrating an example of a pad structure in a second embodiment, and FIG. 25 is a plan view illustrating an example of the pad structure illustrated in FIG. 24.

In the second embodiment, described will be a case where the bonding pad 4c in the pad structure is an Al pad 4ci made of a material containing aluminum as a main component. Incidentally, in the second embodiment, described is a case of forming a 4-layer copper wiring using a dual damascene method in the lower layer wiring formed on the semiconductor chip 4. However, a type of the lower layer wiring and the number of its layers are not particularly limited.

The Al pad 4ci is formed through sputtering or the like, and has a smaller thickness than the rewiring 4cb of the first embodiment. Since the Al pad 4ci has the smaller thickness, when the shape in a plan view of the via 4h is square, the length of one side is about from 2 to 3 µm, which is smaller than 30 µm of the rewiring 4cb.

As illustrated in FIG. 24, a fourth wiring 16 and the Al pad 4ci are connected by the pad via (via 4h). The pad via (via 4h) penetrates the lower layer insulating film 4fb. Since the pad via (via 4h) is formed integrally with the Al pad 4ci made of a metal containing aluminum as a main component, there is the recess 4d above the via. That is, since the Al pad 4ci and the pad via (via 4h) are integrally formed through one time sputtering, the recess 4d is formed above the via.

In addition, a part of the bonding pad 4c (Al pad 4ci) is covered by the insulating film 4i that is the upper layer insulating film, and further the wire ball 5a is connected to the wire ball disposition area 4y on the exposed portion 4ca in the opening 4j of the bonding pad 4c.

In addition, the barrier layer 4ce is formed on a lower surface of the Al pad 4ci. Further, a barrier metal may exist also on an upper surface of the Al pad 4ci, but the barrier metal is removed from the opening 4j in the insulating film 4i that is the upper layer insulating film, and thereby the exposed portion 4ca is exposed.

Incidentally, an adhesion metal, or a laminated film of the adhesion metal and the barrier metal may be formed on the upper surface of the Al pad 4ci. The adhesion metal is, for example, palladium, or gold. The barrier metal is, for example, titanium, titanium nitride, chromium, tantalum, or tantalum nitride.

In addition, in the pad structure of the second embodiment, the adhesion insulating film 4cj is formed on the insulating film 4i that is the upper layer insulating film. The adhesion insulating film 4cj is one for improving adhesion with a resin (sealing resin) contained in a packaging material of the semiconductor device, and the opening of the adhesion insulating film 4cj is positioned outside the opening 4j of the insulating film 4i. As the adhesion insulating film 4cj, polyimide is suitable.

Similarly to the pad structure of the first embodiment also in the pad structure of the second embodiment, as illustrated in FIG. 25, the pad via (via 4h) is disposed so that at least a part of the pad via (via 4h) overlaps with the via disposition area 4x formed by connecting: the corner 4n of the opening 4j in the insulating film 4i; the first point 4q at the same distance as the radius r of the wire ball 5a from the corner 4n; and the second point 4r at the same distance as the radius r from the corner 4n.

That is, in the exposed portion 4ca of the bonding pad 4c configured by the Al pad 4ci, the pad via (via 4h) is disposed so that at least a part of the pad via (via 4h) overlaps with the via disposition area 4x including: the first segment 4u that connects the corner 4n and the first point 4q; the second segment 4v that connects the corner 4n and the second point 4r; and the arc 4w that connects the first point 4q and the second point 4r and forms a convex shape towards the corner 4n.

In addition, similarly to the first embodiment, at least a part in a plan view of the recess 4d formed right above the via overlaps with the via disposition area 4x, and so it can be avoided that the recess 4d and the wire ball 5a overlap each other in a plan view.

Next, described will be an example about a size of each part of the pad structure of the second embodiment illustrated in FIG. 25. A distance T between the end of the Al pad 4ci and the opening 4j in the insulating film 4i has to be secured at about 2.5 µm. In addition, the length K of one side of the opening 4j is 55 µm, and further the distance T between the end of the Al pad 4ci and the opening 4j in the insulating film 4i is 2.5 µm, so that a size S of one side in a plan view of the Al pad 4ci becomes 60 µm.

In addition, a size (length of one side) B of the via 4h is about 3 µm.

From the above, also in the pad structure using the Al pad 4ci of the second embodiment, the square via 4h (pad via) with a side of 3 µm can be disposed without addition of the lead wiring.

Incidentally, similarly to the first embodiment, if it is assumed that a part of the via 4h entering the via disposition area 4x is a square with a side length of Y (overlapping length), $Y=r-r/\sqrt{2}=r\times(1-1/\sqrt{2})=0.29r$, and the pad via (via 4h) with about 0.29 times the radius r of the wire ball 5a can be disposed (overlapped) inside (in the via disposition area 4x). In the second embodiment, if it is assumed that the radius r of the wire ball 5a is 20 µm, the pad via (via 4h) can be disposed inside by 5.8 µm. That is, the pad via (via 4h) can be overlapped with the via disposition area 4x by a size of a square with a side (P) of 5.8 µm.

In addition, since the side wall of the adhesion insulating film 4cj blocks entering of the wire ball 5a even when the adhesion insulating film 4cj is inside from the insulating film 4i that is the upper layer insulating film, the wire ball 5a is blocked by the side wall of the adhesion insulating film 4cj and cannot enter the pad via when the position of the wire ball 5a deviates in the direction of the pad via (via 4h). As a result, in a plan view, the wire ball 5a and the pad via (via 4h) do not overlap each other, so that the connection failure in the wire bonding can be inhibited.

According to the semiconductor device of the second embodiment, the pad via (via 4h) is disposed so that at least a part of the pad via (via 4h) overlaps with the via disposition area 4x in the exposed portion 4ca of the Al pad 4ci, and so the pad via (via 4h) can be disposed without use of the lead wiring.

Thus, reduction of the chip size can be achieved, and miniaturization of the semiconductor device (QFP 1) can be achieved.

In addition, reduction of the chip size can be achieved, so that cost reduction of the semiconductor device (QFP 1) can be achieved.

Since other effects obtained by the semiconductor device of the second embodiment are similar to those of the first embodiment, duplicate descriptions thereof are omitted.

Third Embodiment

FIG. 26 is a data diagram illustrating an example of respective values about a pad structure of a third embodiment. The third embodiment describes the size (representative value, range) of each part in the pad structure of the first embodiment, and the size (representative value, range) of each part in the pad structure of the second embodiment. That is, FIG. 26 indicates representative values and ranges of the pad structures of the first and second embodiments for each of a dimension of one side in a plan view of the via 4h, a dimension of one side in a plan view of the recess 4d, a depth of the recess 4d, the radius r of the wire ball 5a, and an opening dimension of one side in a plan view of the insulating film 4i.

From FIG. 26, it can be seen that the connection failure between the wire ball 5a and the electrode pad tends to occur when the depth of the recess 4d is equal to or greater than 0.5 µm, for example. Accordingly, it can be said that the pad structure of the first embodiment and the pad structure of the second embodiment are effective when the depth of the recess 4d is equal to or greater than 0.5 µm.

<Modification>

Figure 27:
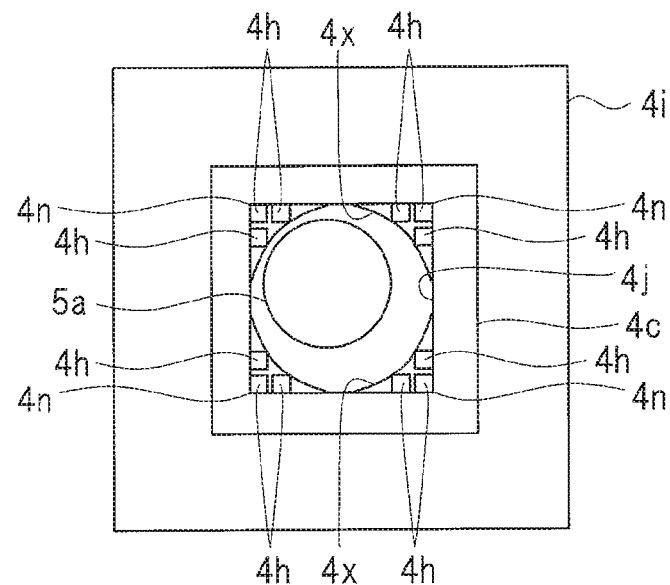
FIG. 27 is an enlarged partial plan view illustrating a pad structure as a modification.

FIG. 27 is an enlarged partial plan view illustrating a pad structure of a modification.

This modification describes modifications such as the shape in a plan view of the via 4h, and the number of vias 4h disposed in one via disposition area 4x. That is, in the first embodiment and the second embodiment, described has been a case where one via 4h is disposed at one corner 4n among four corners of the bonding pad 4c, and a part or an entirety of the one via 4h overlaps with the via disposition area 4x. However, for example, as illustrated in FIG. 27, the plural vias (conductor connection portion) 4h may be disposed at each of a plurality of (for example, four) corners 4n. Alternatively, the via 4h may be disposed at any two or three corners 4n of four corners 4n. Otherwise, the plural vias 4h may be disposed only at one corner 4n. That is, each of the number of corners 4n at which the via 4h is disposed, and the number of vias 4h disposed in one corner 4n may be one or plural.

In addition, the shape in a plan view of each of the via 4h and the recess 4d is not limited to a square, and may be a triangle or a polygon with five or more sides.

Although the invention made by the present inventors has been described specifically based on the embodiments above, the present invention is not limited to the embodiments described above, and it goes without saying that various modifications can be made without departing from the gist thereof.

In the first and second embodiments, although the case where the semiconductor device is the QFP 1 has been described, the semiconductor device is not limited to the QFP 1 and may be another semiconductor device as far as it is a semiconductor device assembled by connecting the conductive wire to the electrode pad of the semiconductor chip.

What is claimed is:

1. A semiconductor device, comprising:
   a semiconductor chip including an electrode pad; and
   a conductive wire including a wire connection portion electrically connected to the electrode pad,
   wherein the semiconductor chip includes:
      a lower layer wiring formed in a lower layer of the electrode pad;
      a first insulating film that covers the lower layer wiring;
      a conductor connection portion that is disposed on the lower layer wiring, embedded in a first opening formed in the first insulating film, and is electrically connected to the lower layer wiring; and
      a second insulating film that covers a part of the electrode pad and on which a second opening that defines an exposed portion of the electrode pad is formed,
   wherein the electrode pad and the conductor connection portion are integrally formed,
   wherein the second opening includes:
      an intersection at which a first imaginary line along one side of two adjacent sides and a second imaginary line along an other side intersect each other,
      a first point on the first imaginary line positioned at a distance of a radius in a plan view of the wire connection portion from the intersection; and
      a second point on the second imaginary line positioned at the distance of the radius from the intersection, and includes a first area including:
         a first segment that connects the intersection and the first point;
         a second segment that connects the intersection and the second point; and
         an arc that connects the first point and the second point and forms a convex shape toward the intersection,
   wherein the wire connection portion is connected to a second area, different from the first area, in the second opening of the electrode pad,
   wherein at least a part of a recess formed in a surface of the electrode pad on the conductor connection portion overlaps with the first area in the plan view, and
   wherein, in the plan view, at least a part of the wire connection portion of the conductive wire is located in a region different from the lower layer wiring.

2. The semiconductor device according to claim 1, wherein the conductor connection portion is disposed, in the plan view, across the first area and an insulating film area on which the second insulating film is formed outside the first area.

3. The semiconductor device according to claim 1, wherein the conductor connection portion is disposed in the first area in the plan view.

4. The semiconductor device according to claim 1, wherein the conductive wire comprises a material containing copper as a main component.

5. The semiconductor device according to claim 1, wherein the electrode pad comprises a material containing copper as a main component.

6. The semiconductor device according to claim 1, wherein the electrode pad comprises a material containing aluminum as a main component.

7. The semiconductor device according to claim 1, wherein at least one alloy layer of a palladium layer, a gold layer, and a nickel layer is disposed between the electrode pad and the wire connection portion.

8. The semiconductor device according to claim 1, wherein a depth of the recess is equal to or greater than 0.5 µm.

9. The semiconductor device according to claim 1, wherein, in the plan view, the first opening overlaps with the second opening.

10. The semiconductor device according to claim 1, wherein the second insulating film is disposed on a surface of the first insulating film.

11. The semiconductor device according to claim 1, wherein, in the plan view, the recess is located in the second opening.

12. The semiconductor device according to claim 1, wherein, in the plan view, an entirety of the recess is located outside of the wire connection portion of the conductive wire.

13. A semiconductor device, comprising:
a semiconductor chip including an electrode pad; and
a conductive wire including a wire connection portion electrically connected to the electrode pad,
wherein the semiconductor chip includes:
a lower layer wiring formed in a lower layer of the electrode pad;
a first insulating film that covers the lower layer wiring;
a conductor connection portion that is disposed on the lower layer wiring, embedded in a first opening formed in the first insulating film, and is electrically connected to the lower layer wiring; and
a second insulating film that covers a part of the electrode pad and on which a second opening that defines an exposed portion of the electrode pad is formed,
wherein the electrode pad and the conductor connection portion are integrally formed,
wherein the second opening includes:
a first side and a second side that form a corner;
a first point on the first side positioned at a distance of a radius in a plan view of the wire connection portion from the corner; and
a second point on the second side positioned at the distance of the radius from the corner, and includes
a first area including:
a first segment that connects the corner and the first point;
a second segment that connects the corner and the second point; and
an arc that connects the first point and the second point and forms a convex shape toward the corner,
wherein the wire connection portion is connected to a second area, different from the first area, in the second opening of the electrode pad,
wherein at least a part of a recess formed on a surface of the electrode pad on the conductor connection portion overlaps with the first area in the plan view; and
wherein, in the plan view, at least a part of the wire connection portion of the conductive wire is located in a region different from the lower layer wiring.

14. The semiconductor device according to claim 13, wherein the conductor connection portion is disposed, in the plan view, across the first area and an insulating film area on which the second insulating film is formed outside the first area.

15. The semiconductor device according to claim 13, wherein the conductor connection portion is disposed in the first area in the plan view.

16. The semiconductor device according to claim 13, wherein the electrode pad comprises a material containing copper as a main component.

17. The semiconductor device according to claim 13, wherein the electrode pad comprises a material containing aluminum as a main component.

18. The semiconductor device according to claim 13, wherein each of the corner and the conductor connection portion is one or plural in number, the conductor connection portion is disposed at the one corner or each of the plural corner.

19. The semiconductor device according to claim 13, wherein a depth of the recess is equal to or greater than 0.5 µm.

* * * * *